United States Patent
Gao et al.

(10) Patent No.: US 12,014,046 B2
(45) Date of Patent: Jun. 18, 2024

(54) METHOD, ELECTRONIC DEVICE, AND COMPUTER PROGRAM PRODUCT FOR STORAGE MANAGEMENT

(71) Applicant: EMC IP Holding Company LLC, Hopkinton, MA (US)

(72) Inventors: Wayne Wei Gao, Shanghai (CN); Jiang Cao, Shanghai (CN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 17/038,137

(22) Filed: Sep. 30, 2020

(65) Prior Publication Data
US 2022/0035531 A1     Feb. 3, 2022

(30) Foreign Application Priority Data

Jul. 31, 2020   (CN) .......................... 202010757580.4

(51) Int. Cl.
| | | |
|---|---|---|
| G06F 12/00 | (2006.01) | |
| G06F 3/06 | (2006.01) | |
| H03M 7/30 | (2006.01) | |

(52) U.S. Cl.
CPC ............ G06F 3/0608 (2013.01); G06F 3/064 (2013.01); G06F 3/0641 (2013.01);
(Continued)

(58) Field of Classification Search
CPC .... G06F 3/0608; G06F 3/0641; G06F 3/0644; G06F 3/064; G06F 3/067; G06F 3/0653
See application file for complete search history.

(56) References Cited

U.S. PATENT DOCUMENTS

| | | | |
|---|---|---|---|
| 10,671,305 B1 * | 6/2020 | Zhang ..................... G06F 3/067 |
| 2016/0217082 A1 | 7/2016 | Osada | |

(Continued)

FOREIGN PATENT DOCUMENTS

CN     104011667 A     8/2014

OTHER PUBLICATIONS

Chuanshuai et al "Leap-based Content Defined Chunking—Theory and Implementation" Published in: 2015 31st Symposium on Mass Storage Systems and Technologies (MSST) (pp. 1-12). Accessed from the Internet <https://ieeexplore.ieee.org/document/7208290?source=IQplus> Accessed Jun. 13, 2023 (Year: 2015).*

(Continued)

*Primary Examiner* — Daniel D Tsui
(74) *Attorney, Agent, or Firm* — Amin, Turocy & Watson, LLP

(57) ABSTRACT

The present disclosure relates to a method, an electronic device, and a computer program product for storage management. According to an example, a method for storage management is provided, including: generating a to-be-stored target data stream based on a to-be-stored object, wherein the target data stream includes at least a part of the object, determining whether the target data stream matches at least one stored data stream that has been stored in a storage apparatus, wherein sizes of the target data stream and the at least one stored data stream depend on their respective content, and, if the target data stream does not match the at least one stored data stream, storing the target data stream in the storage apparatus. Therefore, the performance of storage management can be improved, and the storage costs can be reduced.

20 Claims, 7 Drawing Sheets

(52) U.S. Cl.
CPC .......... *G06F 3/0644* (2013.01); *G06F 3/0653* (2013.01); *G06F 3/067* (2013.01); *H03M 7/3086* (2013.01)

(56) References Cited

U.S. PATENT DOCUMENTS

| | | | |
|---|---|---|---|
| 2016/0350026 A1* | 12/2016 | Yu ........................ | G06F 3/0673 |
| 2020/0089409 A1* | 3/2020 | Ankireddypalle .. | G06F 11/1453 |
| 2020/0293213 A1* | 9/2020 | Haridas .................. | G06F 3/067 |
| 2021/0073178 A1* | 3/2021 | Yin ..................... | G06F 16/1752 |
| 2022/0253222 A1* | 8/2022 | Liu ........................ | G06F 3/064 |

OTHER PUBLICATIONS

Himshai et al "Secure data deduplication mechanism based on Rabin CDC and MD5 in cloud computing environment" Published in: 2017 2nd IEEE International Conference on Recent Trends in Electronics, Information & Communication Technology (RTEICT) (pp. 400-404). Cont. in W (Year: 2017), Accessed from the Internet <https://ieeexplore.ieee.org/document/8256626?source=IQplus> Accessed Jun. 13, 2023 (Year: 2017).*

Chinese Office Action dated Jul. 29, 2023 for Chinese Patent Application No. 202010757580.4, 7 pages.

Chinese Office Action mailed Mar. 1, 2024 for Chinese Patent Application No. 202010757580.4, 9 pages (with translation).

* cited by examiner

METHOD, ELECTRONIC DEVICE, AND COMPUTER PROGRAM PRODUCT FOR STORAGE MANAGEMENT

RELATED APPLICATION

The present application claims the benefit of priority to Chinese Patent Application No. 202010757580.4, filed on Jul. 31, 2020, which application is hereby incorporated into the present application by reference herein in its entirety.

TECHNICAL FIELD

Embodiments of the present disclosure relate generally to storage management, and in particular, to a method, an electronic device, and a computer program product for storage management.

BACKGROUND

With the development of storage technologies, storage apparatuses are getting bigger in space and getting cheaper in price. However, the growth of data is so rapid that it has caused a severe challenge in meeting storage requirements. In order to reduce consumption of storage space, deduplication needs to be performed on storage apparatuses (such as storage servers and cloud storage). A conventional deduplication process is divided into four stages: partitioning, signature generation, indexing, and metadata and data block writing. However, the execution of the four stages is very time-consuming In addition, the partitioning phase and the signature generation phase may further consume a large amount of processing resources.

SUMMARY

A method, an electronic device, and a computer program product for storage management are provided in the embodiments of the present disclosure.

In a first aspect of the present disclosure, a method for storage management is provided. The method includes: generating a to-be-stored target data stream based on a to-be-stored object, wherein the target data stream includes at least a part of the object; determining whether the target data stream matches at least one stored data stream that has been stored in a storage apparatus, wherein sizes of the target data stream and the at least one stored data stream depend on their respective content; and if the target data stream does not match the at least one stored data stream, storing the target data stream in the storage apparatus.

In a second aspect of the present disclosure, an electronic device is provided. The device includes at least one processing unit and at least one memory. The at least one memory is coupled to the at least one processing unit and stores instructions configured to be executed by the at least one processing unit. The instructions, when executed by at least one processing unit, cause the device to perform actions including: generating a to-be-stored target data stream based on a to-be-stored object, wherein the target data stream includes at least a part of the object; determining whether the target data stream matches at least one stored data stream that has been stored in a storage apparatus, wherein sizes of the target data stream and the at least one stored data stream depend on their respective content; and if the target data stream does not match the at least one stored data stream, storing the target data stream in the storage apparatus.

In a third aspect of the present disclosure, a computer program product is provided. The computer program product is tangibly stored on a non-transitory computer readable medium and includes machine-executable instructions; and the machine-executable instructions, when executed, cause a machine to perform any step of the method described according to the first aspect of the present disclosure.

The summary is provided to introduce the selection of concepts in a simplified form, which will be further described in the Detailed Description below. The summary is neither intended to identify key features or essential features of the present disclosure, nor intended to limit the scope of the present disclosure.

BRIEF DESCRIPTION OF THE DRAWINGS

The above and other objectives, features, and advantages of the present disclosure will become more apparent through a more detailed description of example embodiments of the present disclosure with reference to the accompanying drawings. In the example embodiments of the present disclosure, the same reference numerals generally represent the same components.

In the accompanying drawings, identical or corresponding reference numerals represent identical or corresponding parts.

DETAILED DESCRIPTION

Figure 1:
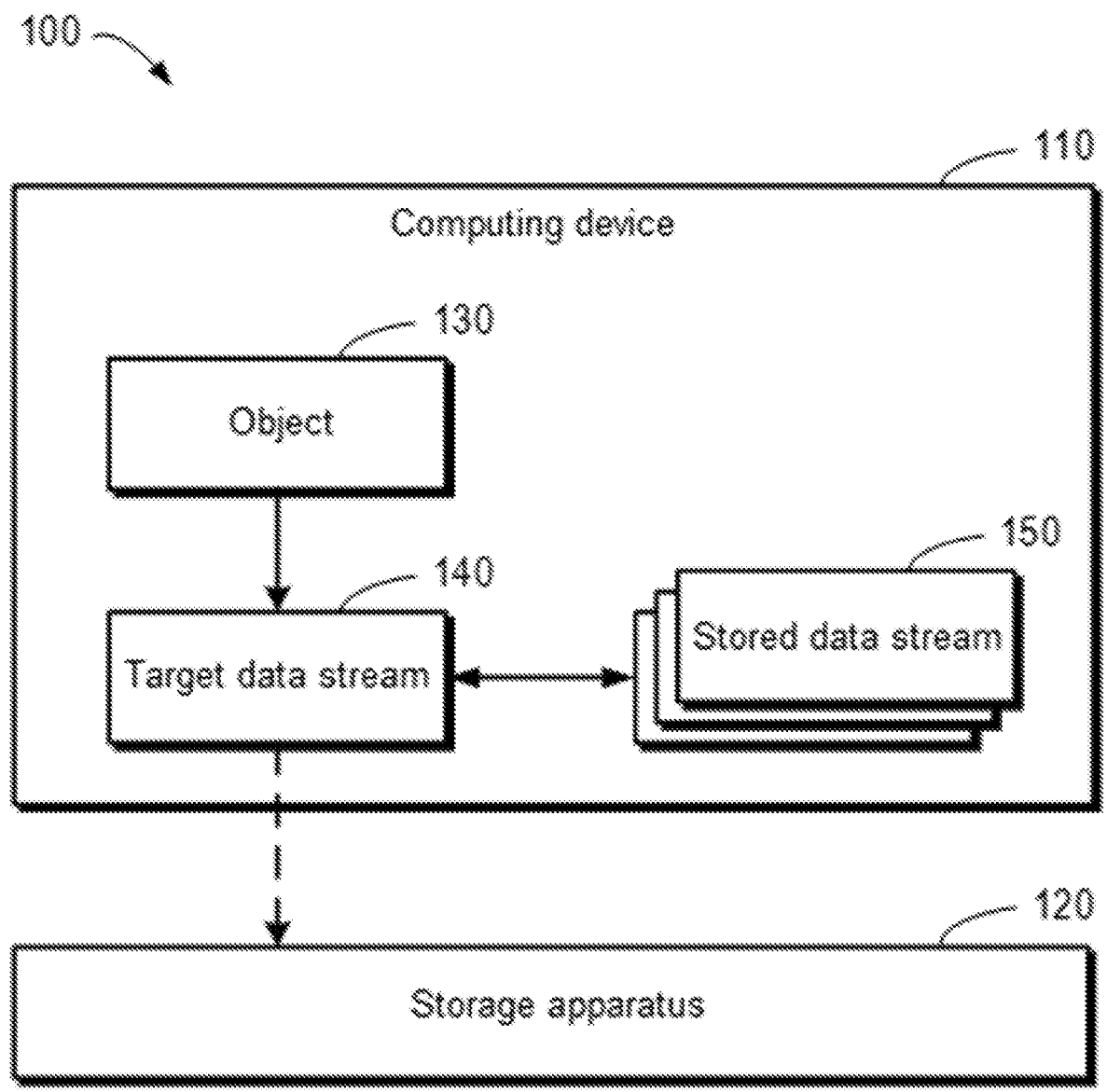
FIG. 1 is a schematic diagram of an example of a storage management environment in which some embodiments of the present disclosure can be implemented.

Embodiments of the present disclosure will be described in more detail below with reference to the accompanying drawings. Although the various embodiments of the present disclosure are shown in the accompanying drawings, it should be understood that the present disclosure can be implemented in various forms and should not be limited by the embodiments set forth herein. Rather, these embodiments are provided to make the present disclosure more thorough and complete and to fully convey the scope of the present disclosure to those skilled in the art.

The term "include" and its variants as used herein indicate open-ended inclusion, that is, "including, but not limited to." Unless specifically stated, the term "or" indicates "and/or." The term "based on" indicates "based at least in part on." The terms "an example embodiment" and "an embodiment" indicate "at least one example embodiment." The term "another embodiment" indicates "at least one additional embodiment." The terms "first," "second," and the like may refer to different or identical objects. Other explicit and implicit definitions may also be included below.

As mentioned above, the four stages in the conventional deduplication process are very time consuming, especially the partitioning stage and the signature generation stage may take up a large amount of processing resources. Therefore, a conventional storage system generally uses a fixed block size for deduplication.

In addition, before a data block is written, metadata and indexes need to be searched for to avoid writing duplicated data. However, because the metadata and indexes of the data block are too large to be placed in a memory (such as a random access memory (RAM)), they are stored in a storage apparatus larger in space but lower in speed. This may significantly affect the throughput of the storage system. Further, it is very time consuming to search for the indexes, and therefore, each data block cannot be very large.

In the case of distributed storage, when data blocks are stored, each of the data blocks is partitioned into a predetermined number of fragments. For example, each data block may be partitioned into 12+4 fragments, that is, 12 data fragments and 4 check fragments. Each fragment is stored on different disks across a plurality of storage nodes in a distributed storage system.

However, the conventional deduplication process does not take content of the data into consideration. If a fixed block size is used for deduplication, space utilization may be significantly reduced. For example, it is assumed that content of one object is the same as content of another object except several letters in the middle. In this case, even if most of the content of the two objects is the same, content of data blocks into which the two objects are partitioned may be completely different due to partitioning according to fixed sizes.

Specifically, it is assumed that one object is (ABCDEFGHIJKLMNOP). When a fixed block size is used, it is partitioned into (ABCD|EFGH|IJKL|MNOP). In addition, it is assumed that the other object is (ABCDEF22GHIJKLMNOP). When a fixed block size is used, it is partitioned into (ABCD|EF22|GHIJ|KLMN|OP). It can be seen that for these two objects, all other data blocks cannot be matched except the first data block. As a result, all the other data blocks need to be stored, resulting in unnecessary storage overhead.

Further, distributed storage takes up a large amount of general processing resources (such as a central processing unit (CPU)). On the one hand, the improvement of computing power of the general processing resources is slow, while on the other hand, the throughput of a storage apparatus (such as a flash memory and a Phase Change Memory (PCM)) continues to increase. In addition, high-speed network cards such as 25G/40G network cards also require more processing resources to handle data grouping and hardware interrupts. In this case, it is difficult to use sufficient general processing resources for partitioning and signature generation, so that the partitioning and signature generation stages are very time consuming.

According to an example embodiment of the present disclosure, an improved solution for storage management is proposed. In the solution, a to-be-stored target data stream is generated based on a to-be-stored object, wherein the target data stream includes at least a part of the object; it is determined whether the target data stream matches at least one stored data stream that has been stored in a storage apparatus, wherein sizes of the target data stream and the at least one stored data stream depend on their respective content; and if the target data stream does not match the at least one stored data stream, the target data stream is stored in the storage apparatus.

In this way, a content-aware deduplication process can be implemented according to the solution by generating a data stream with a variable size based on content of a to-be-stored object. For example, it is assumed that content of one object is the same as content of another object except several letters in the middle. In this case, although there are different middle letters in the two objects, other data blocks into which the two objects are partitioned may be the same because of the partitioning according to the content.

Specifically, it is assumed that one object is (ABCDEFGHIJKLMNOP) and the other object is (ABCDEF22GHIJKLMNOP). Because of the partitioning according to content, these two objects are partitioned into (ABCD|EFGH|IJKL|MNOP) and (ABCD|EF22GH|IJKL|MNOP). It can be seen that all other data blocks can be matched except the second data block. In this case, there is no need to repeatedly store other data blocks that are the same. Therefore, the performance of storage management can be improved, and the storage costs can be reduced.

In the following, specific examples of the solution will be described in more detail with reference to FIG. 1 to FIG. 7. FIG. 1 is a schematic diagram of an example of storage management environment 100 according to some embodiments of the present disclosure. Storage management environment 100 includes computing device 110 and storage apparatus 120. Computing device 110 may be any device having a computing power, for example, but not limited to, a distributed computing system, a mainframe computer, a server, a personal computer, a desktop computer, a notebook computer, a tablet computer, a wearable device, and the like. Storage apparatus 120 may be any device with storage capability, such as a distributed storage system, a cloud storage, a storage server, a hard disk, and a flash memory.

Object 130 is to be stored in storage apparatus 120. In order to reduce consumption of a storage space in storage apparatus 120, deduplication needs to be performed on storage apparatus 120. Therefore, before object 130 is stored in storage apparatus 120, object 130 needs to be partitioned, and a data stream including at least a part of the object (hereinafter referred to as "target data stream 140") is generated. The partitioning of the object is based on content of the object. Therefore, a data stream with a variable size may be generated depending on the content of the object.

Target data stream 140 may be compared with at least one stored data stream 150 of at least one stored object that has been stored in storage apparatus 120. If target data stream 140 matches stored data stream 150, it proves that a data stream the same as target data stream 140 has been stored in storage apparatus 120, and target data stream 140 does not need to be repeatedly stored in storage apparatus 120. Target data stream 140 needs to be stored in storage apparatus 120 only when target data stream 140 does not match stored data stream 150.

In this way, a content-aware deduplication process can be implemented according to the solution by generating a data stream with a variable size based on content of a to-be-stored object or a target data stream. Therefore, the performance of storage management can be improved, and the storage costs can be reduced.

Figure 2:
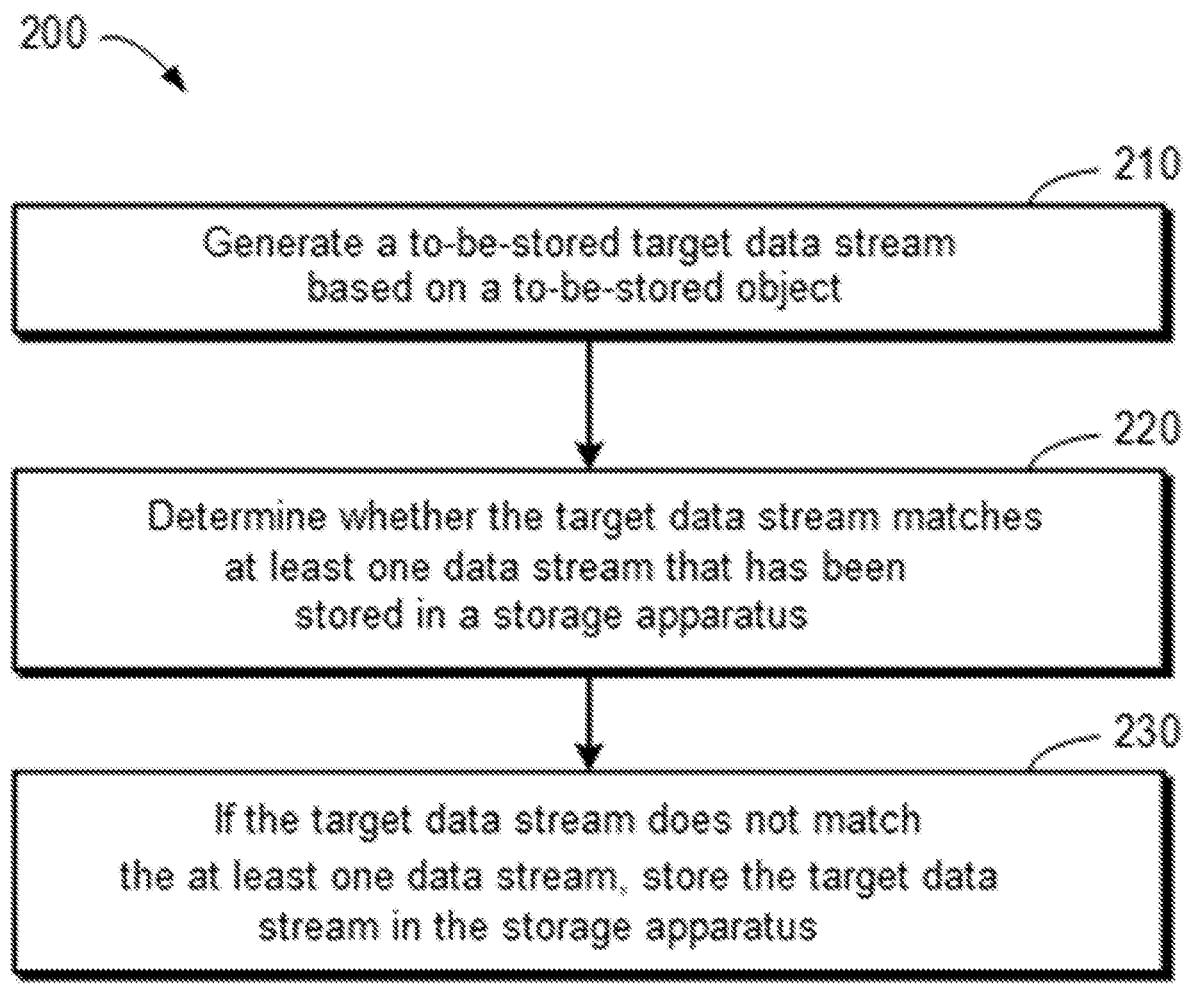
FIG. 2 is a flowchart of a method for storage management according to some embodiments of the present disclosure.

The operations performed on computing device 110 will be described below in detail with reference to FIG. 2 to FIG. 6. FIG. 2 is a flowchart of method 200 for storage management according to some embodiments of the present disclosure. For example, method 200 may be performed by computing device 110 as shown in FIG. 1. It should be understood that method 200 may further include additional steps not shown and/or may skip the steps shown, and that the scope of the present disclosure is not limited in this respect. For ease of understanding, method 200 will be described with reference to FIG. 3 to FIG. 6.

In 210, computing device 110 generates to-be-stored target data stream 140 based on to-be-stored object 130. Target data stream 140 includes at least a part of object 130. The size of target data stream 140 depends on content of object 130, and therefore may also be considered as depending on content of the target data stream. In this case, the size of target data stream 140 generated based on object 130 is variable rather than fixed.

In some embodiments, computing device 110 may generate a data stream with a variable size in the following manner Specifically, computing device 110 may use a sliding window having a predetermined size to partition the object. When a hash value of a part of the object in the sliding window meets a standard, a partitioning boundary is determined, thereby generating a data stream. To this end, two parameter values associated with the standard may be predefined, namely, a first predetermined parameter value and a second predetermined parameter value, wherein the second predetermined parameter value is less than the first parameter value.

Specifically, when the sliding window is moved to a position in the object, the hash value of the part of the object in the sliding window may be modulo divided by the first predetermined parameter value to obtain a modulo division result. If the modulo division result matches the second predetermined parameter value, a boundary of the sliding window at the position may be determined as the partitioning boundary of the object. This process is repeated until the entire object is partitioned. In addition, sizes of blocks into which the object is partitioned may also be within a predetermined size range. Deduplication may be prevented from damage by limiting the sizes of the blocks to a maximum range and a minimum range.

Figure 3:
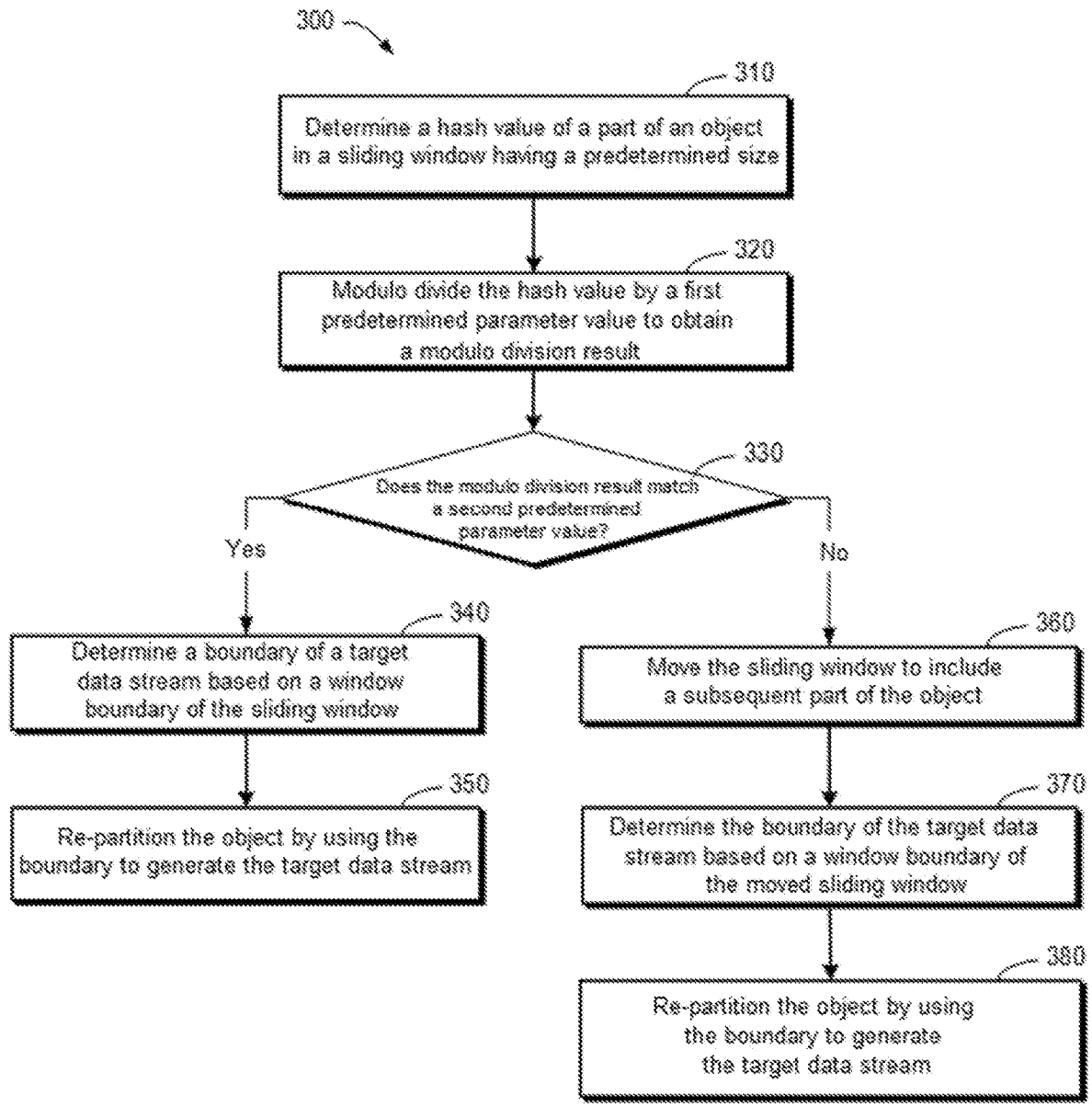
FIG. 3 is a flowchart of a method for generating a target data stream according to some embodiments of the present disclosure.

In the following, an example of a method for generating a target data stream will be described in detail with reference to FIG. 3. In 310, computing device 110 may determine a hash value of a part of object 130 in a sliding window having a predetermined size. The hash value may be obtained through any suitable hash algorithm or function, such as a Rabin fingerprint algorithm, MD5, MD6, and SHA-1.

Computing device 110 may determine a boundary of target data stream 140 based on the hash value. In some embodiments, in 320, computing device 110 may modulo divide the hash value by a first predetermined parameter value to obtain a modulo division result.

In 330, computing device 110 may determine whether the modulo division result matches a second predetermined parameter value. If the modulo division result matches the second predetermined parameter value, in 340, computing device 110 may determine the boundary of target data stream 140 based on a window boundary of the sliding window. Thus, in 350, computing device 110 may use the boundary to partition object 130 to generate target data stream 140.

Otherwise, if the modulo division result does not match the second predetermined parameter value, in 360, computing device 110 may move the sliding window to include a subsequent part of object 130. In 370, the boundary of target data stream 140 may be determined based on a window boundary of the moved sliding window. Thus, in 380, computing device 110 may use the boundary to partition object 130 to generate target data stream 140.

For example, it is assumed that object 130 is (ABCDEFGHIJKLMNOP) and the size of the sliding window is the size of one character. In addition, it is further assumed that at three positions of characters D, H, and L, a modulo division result obtained by modulo dividing a hash value of the part in the sliding window (that is, the characters D, H, and L) by the first predetermined parameter value is equal to the second predetermined parameter value. In this case, object 130 is partitioned into four blocks (ABCD|EFGH|IJKL|MNOP), thereby generating four data streams ("ABCD," "EFGH," "IJKL," and "MNOP").

As another example, it is assumed that object 130 is (ABCDEF22GHIJKLMNOP) and the size of the sliding window is the size of one character. In addition, it is further assumed that at three positions of characters D, H, and L, a modulo division result obtained by modulo dividing a hash value of the part in the sliding window (that is, the characters D, H, and L) by the first predetermined parameter value is equal to the second predetermined parameter value. In this case, object 130 is partitioned into four blocks (ABCD|EF22GH|IJKL|MNOP), thereby generating four data streams ("ABCD," "EF22GH," "IJKL," and "MNOP").

It should be understood that the size of the sliding window may be set to any suitable size, and that a moving distance of the sliding window may also be set to any suitable distance. For example, the size of the sliding window may be set to three characters, and meanwhile the moving distance may be set to move one character at a time.

It can be seen from the above two examples that for different objects with a small amount of differences, variable-sized data streams generated according to content of the objects can mostly match with each other. In fact, all other data blocks can be matched except the second data block.

Referring back to FIG. 2, in 220, computing device 110 determines whether target data stream 140 matches at least one stored data stream 150 that has been stored in the storage apparatus. As described above, target data stream 140 and stored data stream 150 are both generated based on content of the data stream. Therefore, sizes of the target data stream and stored data stream 150 depend on their respective content.

In some embodiments, stored data stream 150 is associated with a stored object. In this case, in order to determine whether target data stream 140 matches these stored data streams 150, computing device 110 may acquire corresponding data stream information of the stored object. The corresponding data stream information of the stored object includes an ID of stored data stream 150. An ID of a data stream represents any suitable information that can uniquely identify the data stream.

Figure 4:
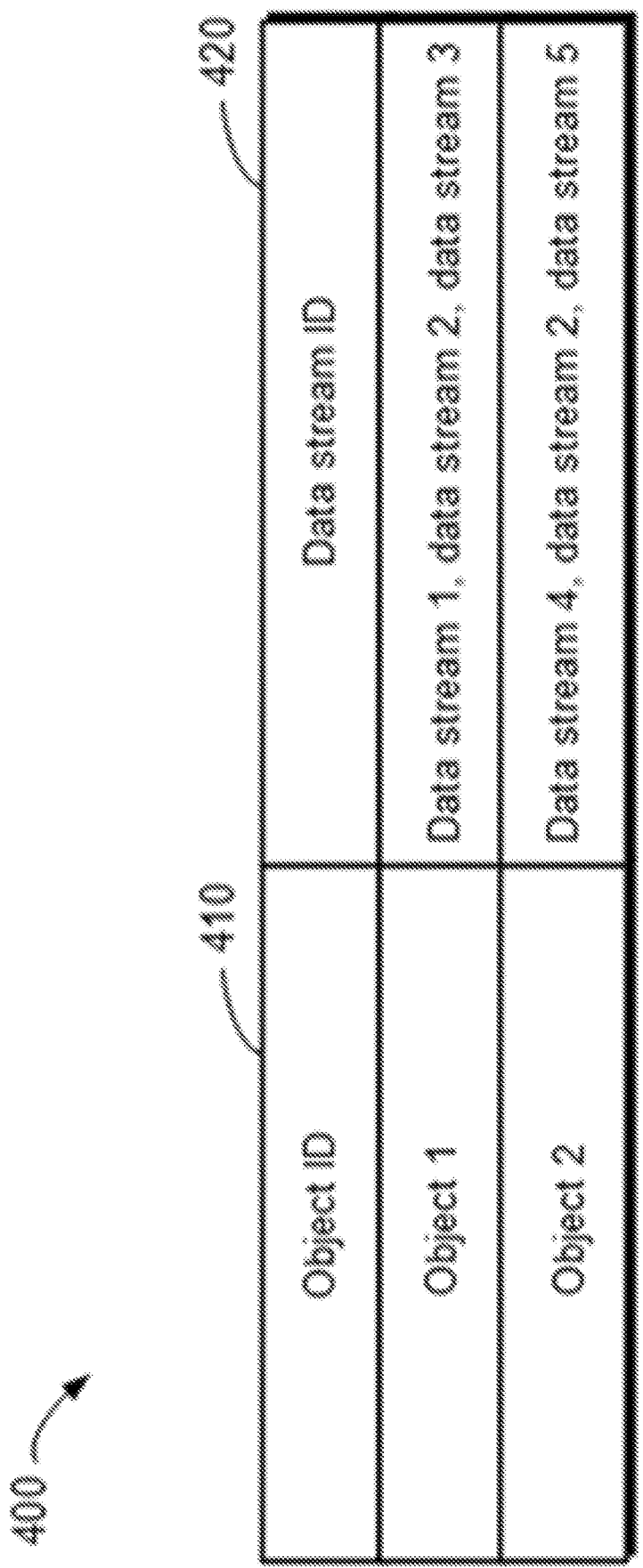
FIG. 4 is a schematic diagram of an example of data stream information according to some embodiments of the present disclosure.

FIG. 4 is a schematic diagram of an example of data stream information 400 according to some embodiments of the present disclosure. As shown in FIG. 4, data stream information 400 includes object ID 410 and data stream ID 420. For a stored object whose ID is "object 1," it generates three data streams, and IDs of these data streams are "data stream 1," "data stream 2," and "data stream 3," respectively. Similarly, for a stored object whose object ID is "object 2," it generates three data streams, and IDs of these data streams are "data stream 4," "data stream 2," and "data stream 5," respectively. It should be understood that data stream information 400 may further be updated. Although not shown, an ID of a data stream generated by object 130 may also be stored in data stream information 400 for use by a future to-be-stored object.

In addition, computing device 110 may compare an ID of target data stream 140 with the ID of each stored data stream 150 to determine whether target data stream 140 matches stored data stream 150. It is assumed that four data streams are generated based on object 130. Any one of the four data streams may be regarded as a target data stream. IDs of the four data streams are "data stream 1," "data stream 5," "data stream 6," and "data stream 7," respectively. For example, the target data stream whose ID is "data stream 1" matches a stored data stream whose ID is "data stream 1." The target data stream whose ID is "data stream 5" matches a stored data stream whose ID is "data stream 5." The target data streams whose IDs are "data stream 6" and "data stream 7" do not match any stored data streams.

If target data stream 140 matches stored data stream 150, computing device 110 does not need to repeatedly store target data stream 140 in storage apparatus 120 as a data block, thereby achieving deduplication.

Otherwise, if target data stream 140 does not match stored data stream 150, in 230, computing device 110 stores target data stream 140 in storage apparatus 120. In some embodiments, computing device 110 may determine an address, for storing target data stream 140, in storage apparatus 120, and store target data stream 140 in storage apparatus 120 based on the address to serve as a data block. The size of the target data stream is variable, and therefore, a size of a data block is also variable.

Figure 5:
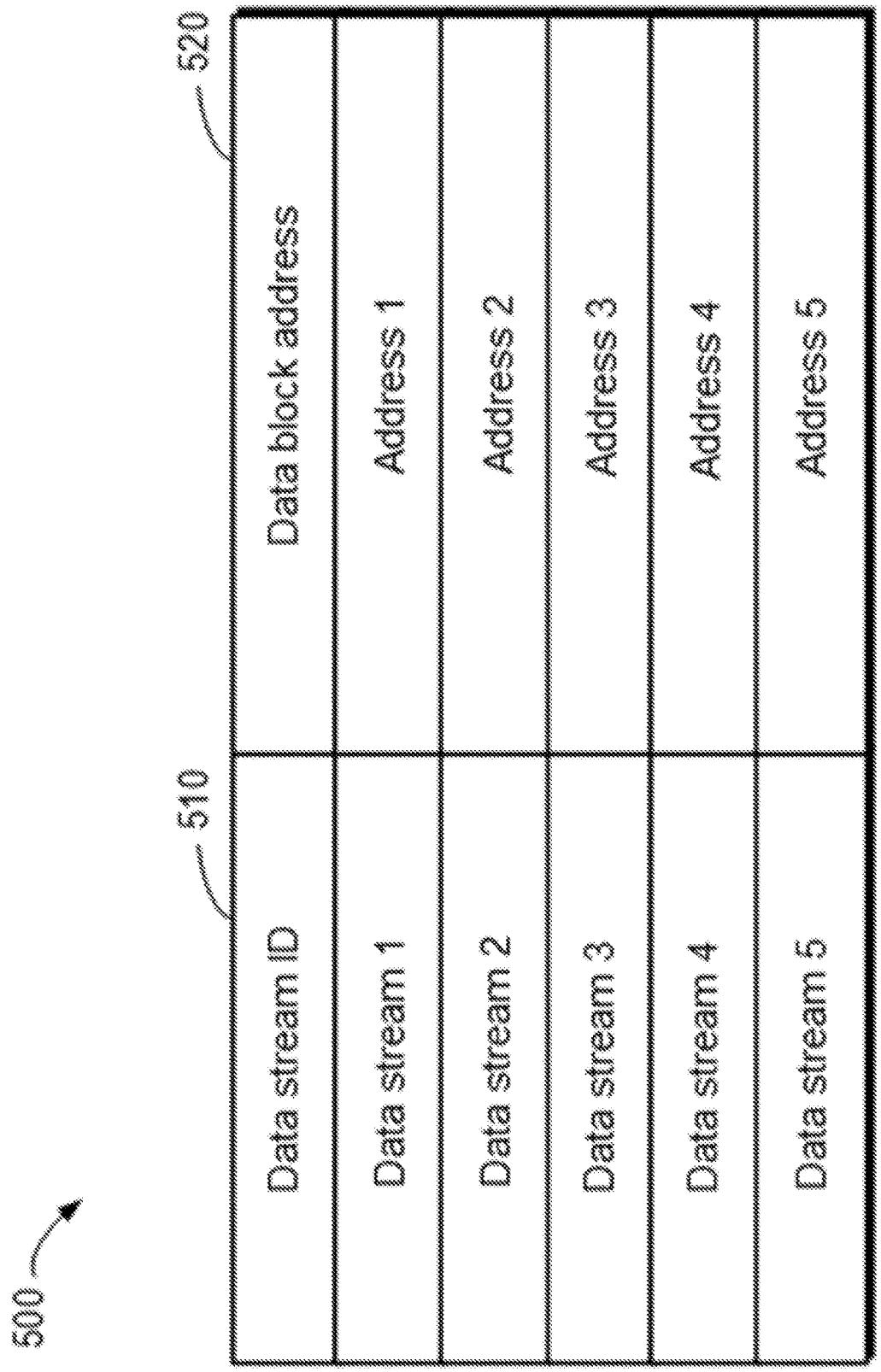
FIG. 5 is a schematic diagram of an example of data block information according to some embodiments of the present disclosure.

In addition, in order to access a data stream, computing device 110 may also generate, based on an address where the data stream is stored as a data block, data block information for accessing the data stream. FIG. 5 is a schematic diagram of an example of data block information 500 according to some embodiments of the present disclosure.

As shown in FIG. 5, data block information 500 includes data stream ID 510 and data block address 520. An address of a data block corresponding to the data stream whose ID is "data stream 1" is "address 1." An address of a data block corresponding to the data stream whose ID is "data stream 2" is "address 2." The rest can be done in the same manner. It should be understood that data block information 500 may further be updated. Although not shown, addresses of data blocks corresponding to data stream "6" and data stream "7" generated by object 130 may also be stored in data block information 500 for addressing the data blocks corresponding to data stream "6" and data stream "7."

Further, nowadays, the capacity of the specialized processing resources is getting stronger. Specialized processing resources such as a graphics processing unit (GPU) have developed into a multi-core processor with high parallelism and powerful computing power. For this reason, the specialized processing resources can be used in the deduplication process to speed up the processing of hash functions such as MD5 or SHA-1. That is, the specialized processing resources can be used to assist general processing resources such as a central processing unit (CPU). For example, the GPU is used as a co-processor of the CPU, and a hash function is executed on the GPU to improve calculation throughput and save the general processing resources. In this case, computing device 110 may use the specialized processing resources to generate a target data stream, and use the general processing resources to generate metadata of such as data block information and data stream information of an object.

In addition, in order to reduce the overhead caused by copying data in a memory between the specialized processing resources and the general processing resources, the general processing resources and the specialized processing resources may share storage resources such as a memory. In this case, when an object is stored, the specialized processing resources acquire an address of the object in the storage resources (for example, acquire a pointer pointing to the object). The specialized processing resources may partition the object to generate one or more data streams, and notify the general processing resources to store these data streams in storage apparatus 120 to serve as data blocks. In addition, the general processing resources may further generate data block information and data stream information. In this way, the computational throughput can be significantly improved and the general processing resources can be saved.

Figure 6:
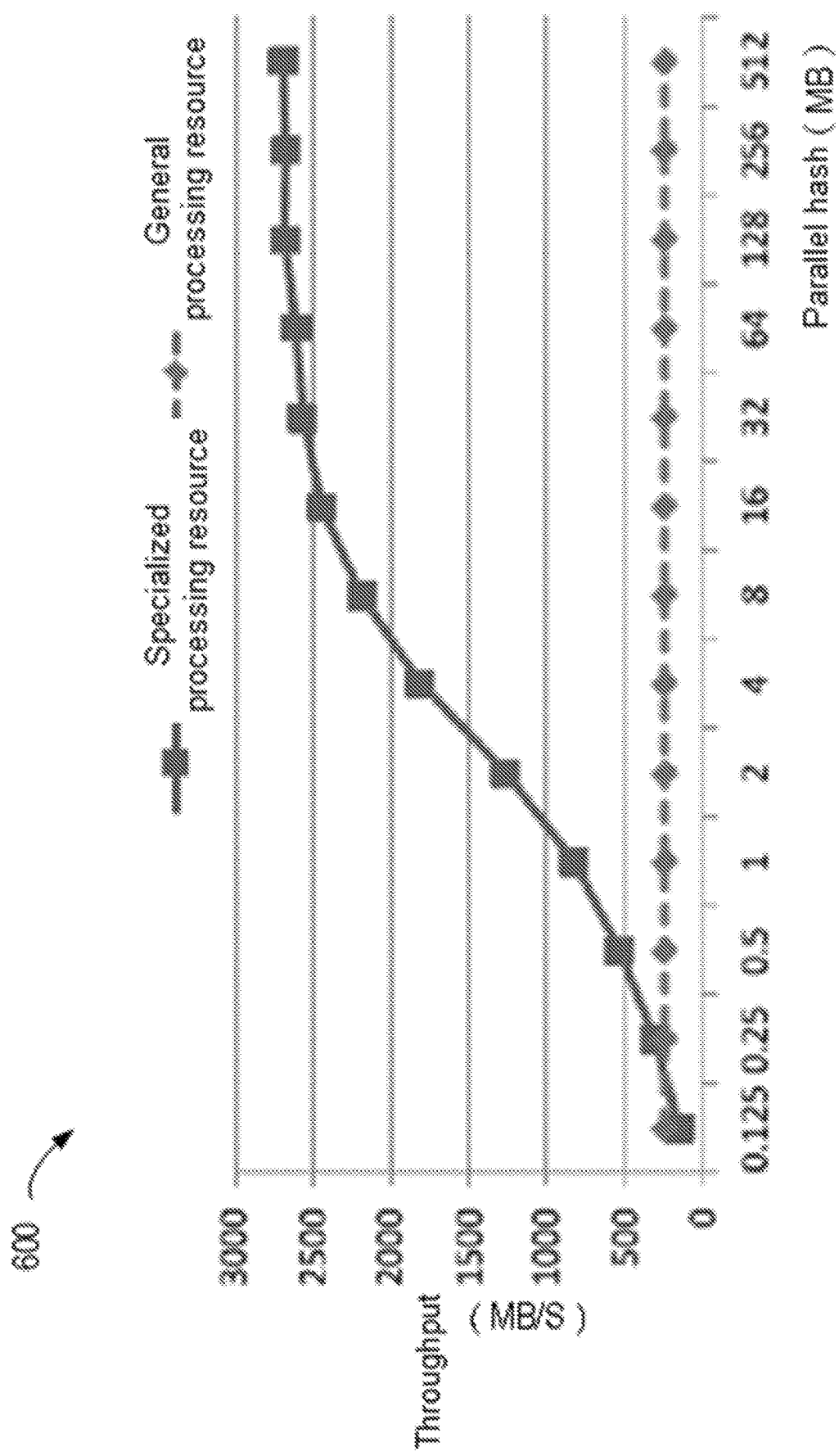
FIG. 6 is a schematic diagram of an example of performance comparison between the use of specialized processing resources and the use of general processing resources.

FIG. 6 is a schematic diagram of an example of performance comparison between the use of specialized processing resources and the use of general processing resources. As shown in FIG. 6, in a deduplication process, the performance obtained by using the specialized processing resources is significantly superior to the performance obtained by using the general processing resources.

Figure 7:
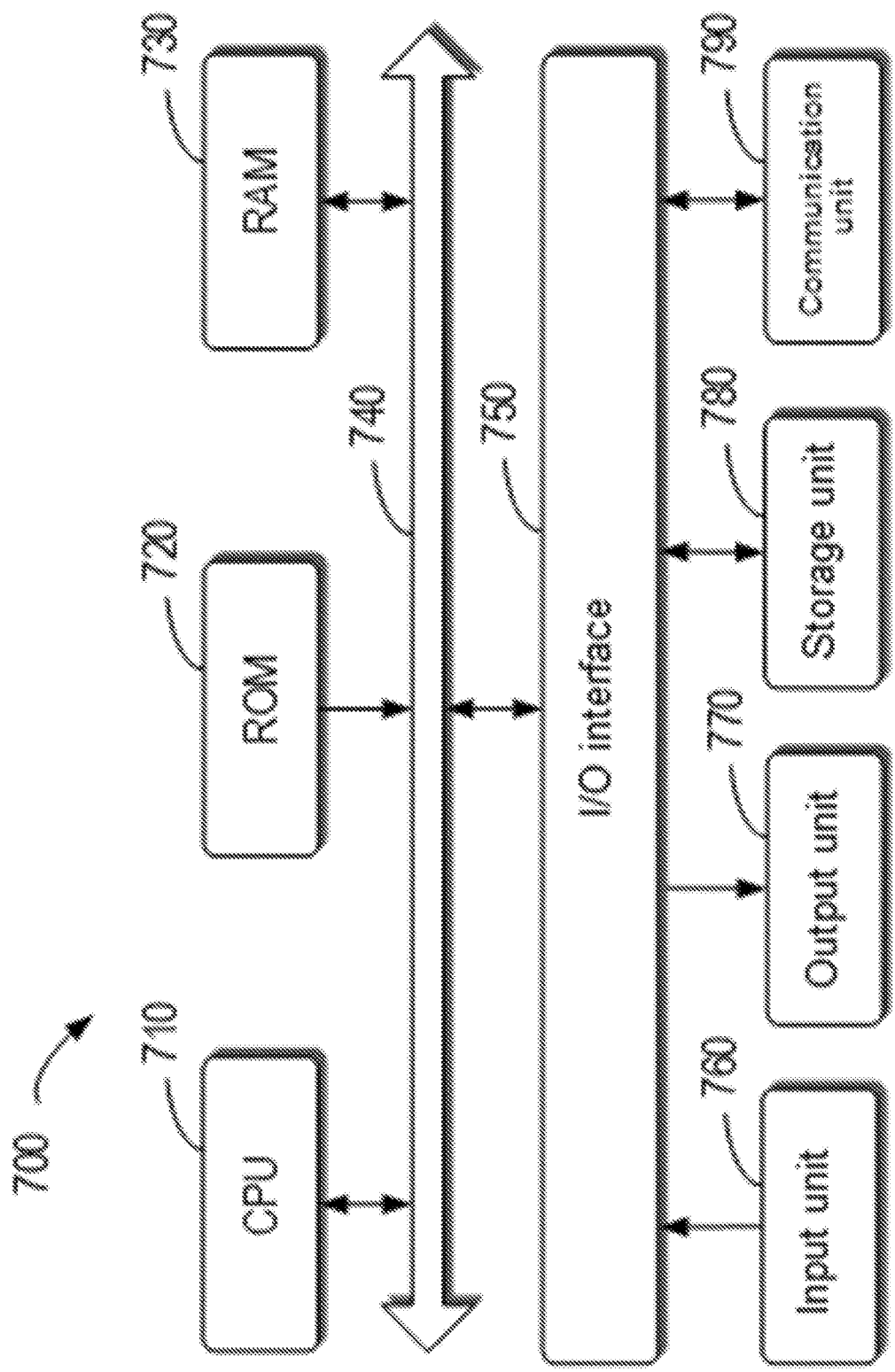
FIG. 7 is a schematic block diagram of an example device that can be used to implement an embodiment of content of the present disclosure.

FIG. 7 is a schematic block diagram of example device 700 that can be configured to implement an embodiment of content of the present disclosure. For example, computing device 110 as shown in FIG. 1 may be implemented by device 700. As shown in the figure, device 700 includes central processing unit (CPU) 710 that may perform various appropriate actions and processing according to computer program instructions stored in read-only memory (ROM) 720 or computer program instructions loaded from storage unit 780 to random access memory (RAM) 730. Various programs and data required for operations of device 700 may also be stored in RAM 730. CPU 710, ROM 720, and RAM 730 are connected to each other through bus 740. Input/output (I/O) interface 750 is also connected to bus 740.

A plurality of components in device 700 are coupled to I/O interface 750, including: input unit 760, such as a keyboard and a mouse; output unit 770, such as various types of displays and speakers; storage unit 780, such as a magnetic disk and an optical disc; and communication unit 790, such as a network card, a modem, and a wireless communication transceiver. Communication unit 790 allows device 700 to exchange information/data with other devices over a computer network such as the Internet and/or various telecommunication networks.

The various processes and processing described above, such as methods 200 and 300, may be performed by processing unit 710. For example, in some embodiments, methods 200 and 300 may be implemented as a computer software program that is tangibly included in a machine-readable medium such as storage unit 780. In some embodiments, part or all of the computer program may be loaded and/or installed onto device 700 via ROM 720 and/or communication unit 790. When the computer program is loaded into RAM 730 and executed by CPU 710, one or more actions of methods 200 and 300 described above can be implemented.

The present disclosure may be a method, an apparatus, a system, and/or a computer program product. The computer program product may include a computer-readable storage medium on which computer-readable program instructions for performing various aspects of the present disclosure are loaded.

The computer-readable storage medium may be a tangible device capable of retaining and storing instructions used by an instruction-executing device. For example, the computer-readable storage medium may be, but is not limited to, an electrical storage apparatus, a magnetic storage apparatus, an optical storage apparatus, an electromagnetic storage apparatus, a semiconductor storage apparatus, or any appropriate combination of the above. More specific examples (a non-exhaustive list) of the computer-readable storage medium include: a portable computer disk, a hard disk, a random access memory (RAM), a read-only memory (ROM), an erasable programmable read-only memory (EPROM or flash memory), a static random access memory (SRAM), a portable compact disk read-only memory (CD-ROM), a digital versatile disk (DVD), a memory stick, a floppy disk, a mechanical coding device such as a punch card or protrusions in a groove on which instructions are stored, and any appropriate combination of the above. The computer-readable storage medium used here is not construed as transient signals themselves, such as radio waves or other freely propagating electromagnetic waves, electromagnetic waves propagating through waveguides or other transmission media (for example, optical pulses through fiber-optic cables), or electrical signals transmitted through electrical wires.

The computer-readable program instructions described herein can be downloaded from a computer-readable storage medium to various computing/processing devices, or downloaded to an external computer or external storage apparatus via a network such as the Internet, a local area network, a wide area network, and/or a wireless network. The network may include copper transmission cables, optical fiber transmission, wireless transmission, routers, firewalls, switches, gateway computers, and/or edge servers. A network adapter card or network interface in each computing/processing device receives a computer-readable program instruction from the network and forwards the computer-readable program instruction for storage in the computer-readable storage medium in each computing/processing device.

The computer program instructions for performing the operations of the present disclosure may be assembly instructions, Instruction Set Architecture (ISA) instructions, machine instructions, machine-related instructions, microcode, firmware instructions, status setting data, or source code or object code written in any combination of one or more programming languages, including object-oriented programming languages, such as Java, Smalltalk, and C++, as well as conventional procedural programming languages, such as "C" language or similar programming languages. The computer-readable program instructions may be executed entirely on a user computer, executed partly on a user computer, executed as a stand-alone software package, executed partly on a user computer while executed partly on a remote computer, or executed entirely on a remote computer or a server. In a case where a remote computer is involved, the remote computer can be connected to a user computer through any kind of networks, including a local area network (LAN) or a wide area network (WAN), or can be connected to an external computer (for example, connected through the Internet using an Internet service provider). In some embodiments, an electronic circuit, such as a programmable logic circuit, a field programmable gate array (FPGA), or a programmable logic array (PLA), can be customized by utilizing status information of the computer-readable program instructions. The electronic circuit may execute the computer-readable program instructions to implement various aspects of the present disclosure.

Various aspects of the present disclosure are described here with reference to flowcharts and/or block diagrams of the methods, the apparatuses (systems), and the computer program products according to the embodiments of the present disclosure. It should be understood that each block in the flowcharts and/or block diagrams and a combination of blocks in the flowcharts and/or block diagrams may be implemented by computer-readable program instructions.

The computer-readable program instructions may be provided to a processing unit of a general purpose computer, a special purpose computer, or another programmable data processing apparatus to produce a machine, such that the instructions, when executed by the processing unit of the computer or another programmable data processing apparatus, generate an apparatus for implementing the functions/actions specified in one or more blocks in the flowcharts and/or block diagrams. The computer-readable program instructions may also be stored in a computer-readable storage medium, to cause a computer, a programmable data processing apparatus, and/or other devices to work in a specific manner, such that the computer-readable medium storing the instructions includes an article of manufacture that contains instructions for implementing various aspects of the functions/actions specified in one or more blocks in the flowcharts and/or block diagrams.

The computer-readable program instructions may also be loaded onto a computer, other programmable data processing apparatuses, or other devices, so that a series of operating steps are performed on the computer, other programmable data processing apparatuses, or other devices to produce a computer-implementing process, so that the instructions executed on the computer, other programmable data processing apparatuses, or other devices implement the functions/actions specified in one or more blocks in the flowcharts and/or block diagrams.

The flowcharts and block diagrams in the accompanying drawings show the architectures, functionalities, and operations of possible implementations of the system, the method, and the computer program product according to a plurality of embodiments of the present disclosure. In this regard, each block in the flowcharts or block diagrams may represent a module, a program segment, or part of an instruction, the module, program segment, or part of an instruction including one or more executable instructions for implementing specified logical functions. In some alternative implementations, the functions marked in the blocks may also occur in an order different from that marked in the accompanying drawings. For example, two successive blocks may actually be performed basically in parallel, or they may be performed in an opposite order sometimes, depending on the functions involved. It should be further noted that each block in the block diagrams and/or flowcharts as well as a combination of blocks in the block diagrams and/or flowcharts may be implemented by using a special hardware-based system for executing specified functions or actions or by a combination of special hardware and computer instructions.

The embodiments of the present disclosure have been described above. The above description is illustrative, rather than exhaustive, and is not limited to the disclosed embodiments. Numerous modifications and changes are apparent to those of ordinary skill in the art without departing from the scope and spirit of the various illustrated embodiments. The selection of terms as used herein is intended to best explain the principles and practical applications of the various embodiments or technical improvements to technologies on the market, or to enable other persons of ordinary skill in the art to understand the various embodiments disclosed herein.

What is claimed is:

1. A method, comprising:
based on an amount of difference between first content of a to-be-stored target data object partitioned into a first data stream of a fixed length and second content of at least one stored data object that has been stored in a storage apparatus, selecting, by a system comprising a processor, a sliding window size of a sliding window;

based on the sliding window, determining, by the system, using a hash function, boundaries of the to-be-stored target data object;

partitioning, by the system, the to-be-stored target data stream object into a data object partitioned in accordance with the boundaries into a second data stream of a variable length within the partitioned data object;

based on the variable length of the second data stream, determining, by the system, whether the partitioned data object matches the at least one stored data object, wherein, to avoid errors in determining whether the partitioned data object matches the at least one stored data object, a range of sizes for the variable length of the second data stream is selected based on the amount of difference; and in response to determining that the partitioned data object does not match the at least one stored data object, storing, by the system, the partitioned data object in the storage apparatus.

2. The method of claim 1, wherein determining the boundaries of the to-be-stored target data object comprises:
based on the sliding window, determining, by the hash function, a hash value of the part of the to-be-stored object in the sliding window.

3. The method of claim 2, wherein determining the boundaries comprises:
modulo dividing the hash value by a first predetermined parameter value to obtain a modulo division result; and
in response to determining that the modulo division result matches a second predetermined parameter value, determining the boundary of the to-be-stored target data object based on a window boundary of the sliding window.

4. The method of claim 3, wherein determining the boundaries further comprises:
in response to determining that the modulo division result does not match the second predetermined parameter value, moving the sliding window, resulting in a moved sliding window that comprises a subsequent part of the to-be-stored target data object; and
determining a boundary of the boundaries based on a window boundary of the moved sliding window.

5. The method of claim 1, wherein the processor comprises specialized processing resources that were specialized to perform floating point operations.

6. The method of claim 5, wherein the specialized processing resources comprise graphics processing unit resources.

7. The method of claim 1, wherein the at least one stored data object is associated with at least one stored object, and determining whether the partitioned data object matches the at least one stored data object comprises:
acquiring corresponding data object information of the at least one stored object, wherein the corresponding data object information of the at least one stored object comprises at least one first identification of the at least one stored data object; and
comparing a second identification of the partitioned data object with the at least one first identification to determine whether the partitioned data object matches the at least one stored data object.

8. The method of claim 1, wherein storing the partitioned data object in the storage apparatus comprises:
determining an address in the storage apparatus for storing the partitioned data object; and
storing, based on the address, the partitioned data object in the storage apparatus to serve as a data stream, wherein the method further comprises:
generating, by the system, based on the address, data stream information for accessing the partitioned data object, the generating the data stream information comprising generating the data stream information by using the processing resources of the processor, wherein the processing resources share storage resources with specialized processing resources for partitioning the data object.

9. The method of claim 1, further comprising:
generating, by the system, data object information of the to-be-stored object, wherein the data object information of the to-be-stored object comprises a first identification of the to-be-stored object and a second identification of the partitioned data object.

10. A device, comprising:
at least one processing unit;
at least one specialized processing unit different from the at least one processing unit; and
at least one memory coupled to the at least one processing unit and storing instructions configured to be executed by the at least one processing unit, wherein the instructions, when executed by the at least one processing unit, cause the device to perform actions comprising:
based on an amount of difference between first content of a target data object to be stored, and second content of at least one stored data object that has been stored in a storage apparatus, identifying a size of a sliding window, wherein the to-be-stored target data object is based on a to-be-stored object,
determining, based on a hash function, boundaries within the target data object based on the sliding window, wherein the target data object is partitioned into a data stream of a fixed size,
partitioning, based on the boundaries, the target data object from being partitioned into the fixed size data stream, to being partitioned into a variable size data stream,
based on comparing the variable size stream of the target data object to stored stream of the at least one stored data object, determining whether the target data object matches the at least one stored data object, wherein, to avoid errors in comparing the variable size data stream to the stored data stream, a range of sizes for the variable size data stream is selected based on the amount of difference, and
based on the target data object being determined not to match the at least one stored data object, storing the target data object in the storage apparatus.

11. The device of claim 10, wherein partitioning the target data object comprises:
determining a hash value of a part of the to-be-stored object in a sliding window having a predetermined size;
determining the boundary of the target data object based on the hash value; and
partitioning, by using the boundary, the to-be-stored object to generate the target data object.

12. The device of claim 11, wherein determining the boundaries of the target data object comprises:
modulo dividing the hash value by a first predetermined parameter value to obtain a modulo division result; and
based on the modulo division result being determined to match a second predetermined parameter value, determining a boundary of the boundaries based on a window boundary of the sliding window.

13. The device of claim 12, wherein determining the boundaries of the target data object further comprises:
based on the modulo division result being determined not to match the second predetermined parameter value, moving the sliding window to comprise a subsequent part of the target data object; and
determining a boundary of the boundaries based on a window boundary of the moved sliding window.

14. The device of claim 10, wherein the at least one specialized processing unit is specialized to perform floating point operations using a different approach than the at least one processing unit.

15. The device of claim 10, wherein the at least one stored data object is associated with at least one stored object that has been stored, and determining whether the target data object matches the at least one stored data object comprises:
acquiring corresponding data object information of the at least one stored object, wherein the corresponding data object information of the at least one stored object comprises at least one first identification of the at least one stored data object; and
comparing a second identification of the target data object with each of the at least one first identification to determine whether the target data object matches the at least one stored data object.

16. The device of claim 10, wherein the actions further comprise:
generating, based on an address, data stream information for accessing the target data object, wherein the address comprises an address in the storage apparatus for storing the target data object.

17. The device of claim 16, wherein generating the data stream information comprises:
generating the data stream information by using general processing resources, wherein the general processing resources share storage resources with specialized processing resources for generating the target data object.

18. The device of claim 10, wherein the actions further comprise:
generating data object information of the to-be-stored object, wherein the data object information of the to-be-stored object comprises an identifier of the to-be-stored object and an identifier of the target data object, and wherein the generating the data object information of the to-be-stored object comprises generating the data object information of the to-be-stored object by using general processing resources, wherein the general processing resources share storage resources with specialized processing resources for generating the target data object.

19. A computer program product, tangibly stored on a non-transitory computer-readable medium and comprising machine-executable instructions, wherein the machine-executable instructions, when executed by a first processor of a first computing device, facilitate performance of operations, the operations comprising:
based on an amount of difference between first content of a to-be-stored target data object partitioned into a first data stream of a fixed length and second content of at least one stored data object that has been stored in a storage apparatus, selecting a sliding window size of a sliding window, wherein the to-be-stored target data object is based on a to-be-stored object;
based on the sliding window, determining, via a hash function, boundaries of the to-be-stored target data object;
partitioning the to-be-stored target data object into a data object partitioned in accordance with the boundaries into a second data stream of a variable length within the partitioned data object;
based on the variable length of the second data stream, avoiding errors in determining whether the partitioned data object matches the at least one stored data object, comprising using a range of sizes for the variable length of the second data stream selected based on the amount of difference; and
in response to determining that the partitioned data object does not match the at least one stored data object, storing the partitioned data object in the storage apparatus.

20. The computer program product of claim 19, wherein storing the partitioned data object in the storage apparatus comprises:
determining an address in the storage apparatus for storing the partitioned data object; and
storing, based on the address, the partitioned data object in the storage apparatus to serve as a data stream.

* * * * *